United States Patent
Roshelli, Jr. et al.

(10) Patent No.: US 8,697,337 B2
(45) Date of Patent: Apr. 15, 2014

(54) LAMINATING APPARATUS AND METHOD OF USING THE SAME

(76) Inventors: Albert G. Roshelli, Jr., Peachtree City, GA (US); David A. Recchia, Smyrna, GA (US)

(*) Notice: Subject to any disclaimer, the term of this patent is extended or adjusted under 35 U.S.C. 154(b) by 16 days.

(21) Appl. No.: 13/355,769

(22) Filed: Jan. 23, 2012

(65) Prior Publication Data

US 2013/0189625 A1     Jul. 25, 2013

(51) Int. Cl.
*B32B 37/02*     (2006.01)
*B32B 37/06*     (2006.01)

(52) U.S. Cl.
USPC ......... 430/306; 430/302; 156/555; 156/309.9

(58) Field of Classification Search
USPC .................. 430/302, 306; 156/555, 309.9
See application file for complete search history.

(56) References Cited

U.S. PATENT DOCUMENTS

| | | | |
|---|---|---|---|
| 5,262,275 A | 11/1993 | Fan | |
| 5,316,609 A | 5/1994 | Guither et al. | |
| 5,925,500 A | 7/1999 | Yang et al. | |
| 6,238,837 B1 | 5/2001 | Fan | |
| 6,244,322 B1 * | 6/2001 | Paque | 156/555 |
| 6,296,032 B1 | 10/2001 | Louie et al. | |
| 7,025,847 B2 | 4/2006 | Carlson et al. | |
| 2003/0098130 A1 | 5/2003 | Kiener et al. | |
| 2007/0059642 A1 | 3/2007 | Dudek et al. | |
| 2011/0079158 A1 | 4/2011 | Recchia et al. | |
| 2011/0081614 A1 | 4/2011 | Recchia | |

FOREIGN PATENT DOCUMENTS

| | | |
|---|---|---|
| WO | 99/24257 | 5/1999 |
| WO | 2007/055394 A1 | 5/2007 |

* cited by examiner

*Primary Examiner* — Daborah Chacko Davis
(74) *Attorney, Agent, or Firm* — Carmody Torrance Sandak & Hennessey LLP

(57) ABSTRACT

An apparatus for laminating a film to a substrate and a method of using the same is described. The apparatus comprises a) a heated laminating roller and a second roller, wherein said heated laminating roller and said second roller are opposably mounted and form a nip; b) a drive mechanism for rotating the heated laminating roller and second roller; c) a film supply roller adapted to support a roll of film and supply the film over an outer surface of the heated laminating roller and into the nip, wherein the film is contactable with a top surface of the substrate at a point where the substrate advances through the nip; and d) a splitter bar in contact with the film supplied from the supply roller, wherein the position of the splitter bar controls a wrap angle between the film and the heated laminating roller.

15 Claims, 2 Drawing Sheets

LAMINATING APPARATUS AND METHOD OF USING THE SAME

FIELD OF THE INVENTION

The present invention relates generally to a laminating apparatus and a method of using the same.

BACKGROUND OF TILE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of a backing, or support layer; one or more unexposed photocurable layers; a protective layer or slip film; and often a protective cover sheet.

The support sheet or backing layer lends support to the plate. The support sheet, or backing layer, can be formed from a transparent or opaque material such as paper, cellulose film, plastic, or metal. The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. More than one photocurable layer may also be used.

The photocurable materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light. In this process, the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

The shape of the dots and the depth of the relief, among other factors, affect the quality of the printed image. It is very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the dot survives processing they are susceptible to damage on press. For example small dots often fold over and/or partially break off during printing causing either excess ink or no ink to be transferred.

Furthermore, photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. It is therefore highly desirable for the dissolved oxygen to be removed from the resin composition before image-wise exposure so that the photocurable resin composition can be more rapidly and uniformly cured.

As described in related patent application Ser. No. 12/571,523 to Recchia and Ser. No. 12/660,451 to Recchia et al., the subject matter of each of which is herein incorporated by reference in its entirety, it has been found that a particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder. An important method of beneficially changing and/or tailoring the shape of printing dots formed on a printing element is accomplished by limiting the diffusion of air into the photocurable layer. As described in related patent application Ser. No. 13/205,107 to Gotsick et al., the subject matter of which is herein incorporated by reference in its entirety, the use of a barrier layer, such as an oxygen barrier membrane during the imaging and exposing steps produces printing dots having at least one of the particular set of geometric characteristic that is beneficially changed in relation to dots formed without the use of a barrier layer.

The barrier layer may be laminated to the surface of the printing plate using pressure and/or heat in a lamination process.

In some instances, however, the quality of the laminate has been affected by the existences of wrinkles and/or waves in the laminate barrier layer film during lamination. Therefore, it would be desirable to improve the lamination process to control the tension of the laminating film and to also remove wrinkles and/or waves in the barrier layer film prior to lamination.

SUMMARY OF THE INVENTION

It is an object of the present invention to provide an improved lamination process.

It is another object of the present invention to improve the quality of a laminated product by removing wrinkles and/or waves in the laminate film prior to lamination.

It is still another object of the present invention to control the tension of the laminating film during the lamination process.

To that end, in a preferred embodiment, the present invention relates generally to a method of laminating a film to a substrate using heat and pressure, the method comprising the steps of:
  a. supplying the substrate to a nip formed between a heated laminating roller and a second roller;
  b. supplying a laminating film from a laminating film supply roller over an outer surface of the heated laminating roller and into the nip formed between the heated laminating roller and the second roller; wherein the laminating film contacts a top surface of the substrate at a point where the substrate advances through the nip;
  c. rotating the heated laminating roller in a first direction and the second roller in an opposite direction to advance the substrate with the laminating film thereon through the nip to laminate the film to the top of the substrate; wherein a wrap angle between the laminating film, and the heated laminating roller as measured between a point where the laminating film first contacts the outer surface of the heated laminating roller and a point where the laminating film first contacts the top surface of the substrate is at least 125°.

In another preferred embodiment, the present invention relates generally to an apparatus for laminating a laminating film to a substrate, the apparatus comprising:
  a. a heated laminating roller and a second roller, wherein said heated laminating roller and said second roller are opposably mounted and form a nip therebetween for receiving the substrate to be laminated;
  b. a drive mechanism for rotating the heated laminating roller and second roller, wherein the heated laminating roller is rotated in a first direction and the second roller is rotated in an opposite direction to advance the substrate through the nip formed between the heated laminating roller and second roller;
  c. a laminating film supply roller adapted to support a roll of laminating film and supply the laminating film over an outer surface of the heated laminating roller and into the nip formed between the heated laminating roller and the second roller, wherein the laminating film is contactable with a top surface of the substrate at a point where the substrate advances through the nip; and
  d. a splitter bar positioned at a suitable location between the laminating film supply roller and the heated laminating roller and in contact with the laminating film supplied from the supply roller, wherein the position of the splitter bar controls a wrap angle between the laminating film and the heated laminating roller as measured between a point where the laminating film first contacts the outer surface of the heated lamination roller and a point where the laminating film first contacts the top surface of the substrate.

BRIEF DESCRIPTION OF THE FIGURES

The above set forth and other features of the invention are made more apparent in the ensuing Description of the Preferred Embodiments when read in conjunction with the attached Drawings, wherein.

Identical reference numerals in the figures are intended to indicate like parts, although not every feature in every figure may be called out with a reference numeral.

DETAILED DESCRIPTION OF PREFERRED EMBODIMENTS

Figure 1:
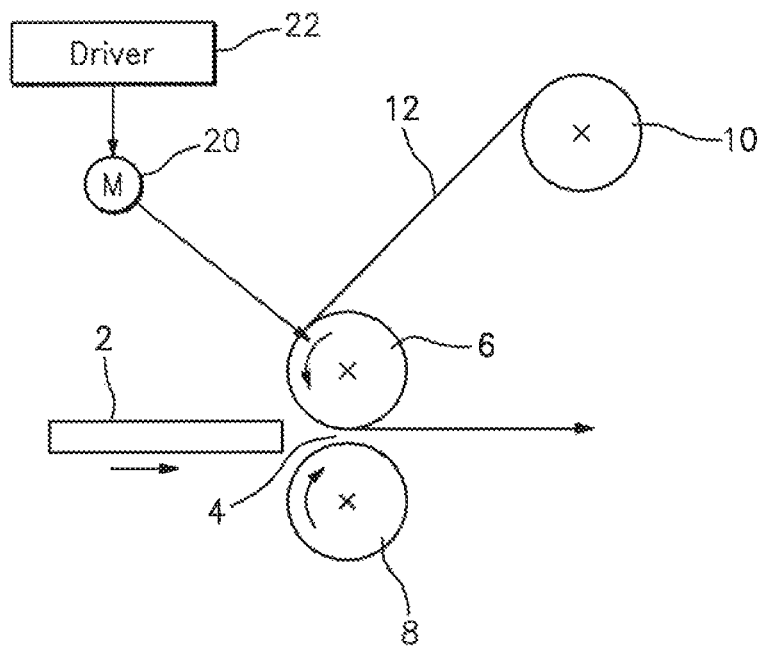
FIG. 1 depicts a laminating apparatus in accordance with the present invention.
Figure 2:
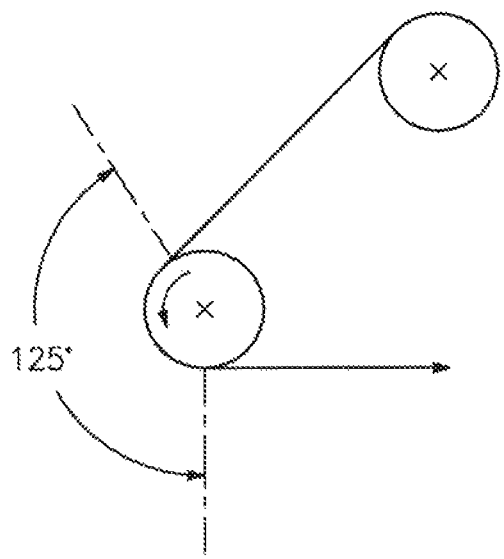
FIG. 2 depicts a laminating apparatus in accordance with the present invention, showing the wrap angle between the laminating film and the heated lamination roller.

The present invention relates generally to the use of a splitter bar or other similar means to control the tension and minimize and remove wrinkles and waves in a laminating film or membrane prior to lamination to an underlying substrate. The inventors of the present invention have found that by moving the splitter bar, which changes the wrap angle between the laminating film and the heated laminating roller, a substantial improvement in the reliability of the lamination process can be realized.

Splitter bars have typically been used in laminating systems to separate release liners from pressure sensitive adhesives. However, to the inventor's knowledge, splitter bars and other similar devices have not previously been used to control tension or eliminate wrinkles during the lamination process.

The advantage of the present invention is to keep constant controlled contact of the membrane to the heated laminating roller to enable wrinkle free lamination at the nip point. This greatly increases the quality of the output.

In a preferred embodiment, the present invention relates generally to a method of laminating a film to a substrate using heat and pressure, the method comprising the steps of:
   a. supplying the substrate to a nip formed between a heated laminating roller and a second roller;
   b. supplying a laminating film from a laminating film supply roller over an outer surface of the heated laminating roller and into the nip formed between the heated laminating roller and the second roller; wherein the laminating film contacts a top surface of the substrate at a point where the substrate advances through the nip; and
   c. rotating the heated laminating roller in a first direction and the second roller in an opposite direction to advance the substrate with the laminating film thereon through the nip, thereby laminating the film to the top of the substrate;
wherein a wrap angle between the laminating film and the heated laminating roller as measured between a point where the laminating film first contacts the outer surface of the heated laminating roller and a point where the laminating film first contacts the top surface of the substrate is at least 125°.

In a preferred embodiment, the substrate is a substantially planar substrate.

Furthermore, the wrap angle between the laminating film and the heated laminating roller as measured between a point where the laminating film contacts the outer surface of the heated laminating roller and a point where the laminating film contacts the top surface of the substrate is more preferably at least 145°, and most preferably is at least about 180°.

In a preferred embodiment, the wrap angle between the laminating film and the heated laminating roller as measured between a point where the laminating film contacts the outer surface of the heated laminating roller and a point where the laminating film contacts the top surface of the planar substrate is controlled by positioning a splitter bar at a suitable location between the laminating film supply roller and the heated laminating roller and in contact with the laminating film. The splitter bar puts tension on the laminating film, thereby increasing the wrap angle between the laminating film and the heated lamination roller.

The heated laminating roller is typically maintained at a temperature of at least about 150° F., more preferably at a temperature of at least about 200° F. However, one skilled in the art would recognize that the temperature of the laminating roller would depend at least in part on the melting point of the particular laminating film selected and would choose a suitable temperature of the laminating film accordingly.

While the laminating method described herein is beneficially used in a manufacturing process for preparing relief image printing plates, it can be seen that the lamination method described herein is not limited to that purpose. It is envisioned that the lamination method of the present invention is usable in various systems where it is desirable to provide greater control of the tension of a laminating membrane or layer to minimize and remove wrinkles and waves prior to laminating the film or membrane to an underlying substrate.

As described herein, in one embodiment, the substrate is a photosensitive printing blank comprising a laser ablatable layer disposed on at least one photocurable layer, and the laser ablatable mask is laser ablated to create an in situ negative in the laser ablatable mask layer. In addition, the lamination film is an oxygen barrier membrane.

The oxygen barrier membrane layer is laminated to the surface of the printing plate using pressure and/or heat in the lamination process. In one embodiment, the oxygen barrier membrane is laminated to the top of the laser ablatable mask layer after the in situ negative has been created therein and, thereafter the at least one photocurable layer is exposed to actinic radiation through the in situ negative. In another embodiment, the oxygen barrier membrane is laminated to the top of the laser ablatable mask layer and then the in situ negative is created therein. In either instance, the oxygen barrier membrane is removed from the top of the laser ablatable mask layer before the development step. The removal of the oxygen barrier membrane may be removed by either mechanical or chemical means.

If the oxygen barrier membrane is laminated to the top of the laser ablatable mask layer after the in situ negative has been created therein, the method may further comprises the steps of:
   a. exposing the at least one photocurable layer to actinic radiation through the barrier layer and the in situ negative;
   b. removing the barrier layer; and
   c. developing the imaged and exposed photosensitive printing blank to reveal the relief image therein, said relief image comprising the plurality of relief dots;
wherein the presence of the oxygen barrier membrane produces printing dots having at least one geometric characteristic selected from the group consisting of planarity of a top surface of the printing dots, shoulder angle of the printing dots and edge sharpness of the printing dots, beneficially changed in relation to dots formed without the use of a barrier layer.

Development may be accomplished by various methods, including water development, solvent development and thermal development, by way of example and not limitation. Finally, the relief image printing element is mounted on a printing cylinder of a printing press and printing is commenced.

A wide range of materials can serve as the oxygen barrier membrane. Three qualities that the inventors have identified in producing effective oxygen barrier membranes include optical transparency, low thickness and oxygen transport inhibition. Oxygen transport inhibition is measure in terms of a low oxygen diffusion coefficient. As noted, the oxygen diffusion coefficient of the membrane should be less than $6.9\times10^{-9}$ m$^2$/sec., preferably less than $6.9\times10^{-10}$ m$^2$/sec. and most preferably less than $6.9\times10^{-11}$ m$^2$/sec.

Examples of materials which are suitable for use as the oxygen barrier membrane of the present invention include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films. In one preferred embodiment, the oxygen barrier membrane layer comprises a polypropylene film or a polyethylene terephthalate film.

The thickness of the oxygen barrier membrane should be consistent with the structural needs for handling of the film and the film/photopolymer plate combination. Barrier thicknesses between about 5 and 300 microns are preferred, more preferably between about 10 to about 200 microns and most preferably between about 1 to about 20 microns.

The oxygen barrier membrane also needs to have a sufficient optical transparency so that the oxygen barrier membrane will not detrimentally absorb or deflect the actinic radiation used to expose the photosensitive printing blank. As such it is preferable that the oxygen barrier membrane have an optical transparency of at least 50%, most preferably at least 75%.

The oxygen barrier membrane also needs to be sufficiently impermeable to oxygen diffusion so that it can effectively limit diffusion of oxygen into the photocurable layer during exposure to actinic radiation. The inventors herein have determined that the oxygen barrier membranes noted above in the thicknesses noted above will substantially limit the diffusion of oxygen into the photocurable layer when used as described herein.

In addition to limiting the diffusion of oxygen into the photocurable layer, the oxygen barrier membrane can be used to impart or impress a desired texture to the printing surfaces of the printing element or to control the surface roughness of the printing surfaces of the printing element to a desired level. In one embodiment of the present invention, the oxygen barrier membrane comprises a matte finish and the texture of the matte finish may be transferred to the plate surface to provide a desired surface roughness on the surface of the printing plate. For example, in one embodiment, the matte finish provides an average surface roughness that is between about 700 and about 800 nm. In this instance the oxygen barrier membrane comprises a polypropylene film with a cured photopolymer layer thereon and the cured photopolymer layer has a defined topographic pattern defined thereon. The texture or roughness of the oxygen barrier membrane surface will be impressed into the surface of the photopolymer (photocurable) layer during the lamination step. In general, surface roughness in this regard can be measured using a Veeco Optical Profilometer, model Wyko NT 3300 (Veeco Instruments, Plainville, N.Y.).

In another embodiment of the present invention, the oxygen barrier membrane comprises a smooth nanotechnology film with a roughness of less than 100 nm. In this embodiment, the average surface roughness of the printing plate can be controlled to less than about 100 nm.

In one preferred embodiment the shoulder angle of the printing dots created by the method described herein is greater than 50°, preferably greater than about 70°. In addition, the edge sharpness of the printing dots created by the method described herein, defined as a ratio of the radius of curvature at the intersection of the shoulder and a top of the relief dot ($r_e$) to the width of the dot's top or printing surface (p) is preferably less than 5%, more preferably, less than 2%. As discussed above, related patent application Ser. No. 12/571,523 to Recchia, Ser. No. 12/660,451 to Recchia et al., and Ser. No. 13/205,107 to Gotsick et al., the subject matter of each of which is herein incorporated by reference in its entirety, describe the particular set of geometric characteristics define a flexo dot shape that yields superior printing performance, including but not limited to (1) planarity of the dot surface; (2) shoulder angle of the dot; (3) depth of relief between the dots; and (4) sharpness of the edge at the point where the dot top transitions to the dot shoulder.

The present invention also relates generally to a laminating apparatus for laminating a laminating film to an underlying substrate using the method described herein.

As seen in FIG. 1, in a preferred embodiment, the laminating apparatus of the invention comprises:
  a. a heated laminating roller 6 and a second roller 8, wherein said heated laminating roller 6 and said second roller 8 are opposably mounted and form a nip 4 therebetween for receiving the substrate 2 to be laminated;
  b. a drive mechanism for rotating the heated laminating roller 6 and second roller 8, wherein the heated laminating roller 6 is rotated in a first direction and the second roller 8 is rotated in an opposite direction to advance the substrate 2 through the nip 4 formed between the heated laminating roller 6 and second roller 8;
  c. a laminating film supply roller 10 adapted to support a roll of laminating film 12 and supply the laminating film 12 over an outer surface of the heated laminating roller 6 and into the nip 4 formed between the heated laminating roller 6 and the second roller 8, wherein the laminating film 12 is contactable with a top surface of the substrate 2 at a point where the substrate 2 advances through the nip 4; and
  d. a splitter bar 14 (shown in FIGS. 3 and 4) positioned at a suitable location between the laminating film supply roller 10 and the heated laminating roller 6 and in contact with the laminating film 12 supplied from the laminating film supply roller 10, wherein the position of the splitter bar 14 controls a wrap angle between the laminating film 12 and the heated laminating roller 6 as measured between a point where the laminating film 12 first contacts the outer surface of the heated laminating roller 6 and a point where the laminating film 12 first contacts the top surface of the substrate 2.

As discussed above, the wrap angle between the laminating film 12 and the heated laminating roller 6 as measured between a point where the laminating film 12 first contacts the outer surface of the heated laminating roller 6 and a point where the laminating film 12 first contacts the top surface of the substrate 2 is preferably at least about 125°, more preferably at least about 1.45°, and most preferably about 180°.

The drive mechanism for rotating the heated laminating roller 6 and the second roller 8 typically comprises a driver 22 which drives a motor 20 to rotate the heated laminating roller 6 in a first direction and the second roller 8 in a second direction.

The heated laminating roller 6 typically comprises a heated core that can be controlled to maintain an outer surface of the heated laminating roller 6 at a desired temperature with an elastic roller disposed around the heated core that may be formed of silicone rubber or another similar elastic material. Suitable control means (not shown) can be used to maintain the heated laminating roller at the desired temperature for the particular laminating film being used.

Finally, the apparatus described herein may further comprise means for trimming the laminated substrate as is generally well known in the art. In one embodiment, the means for trimming the laminated substrate is a rotating cutter. Other suitable cutting and trimming means would also be usable in the practice of the invention.

Figure 3:
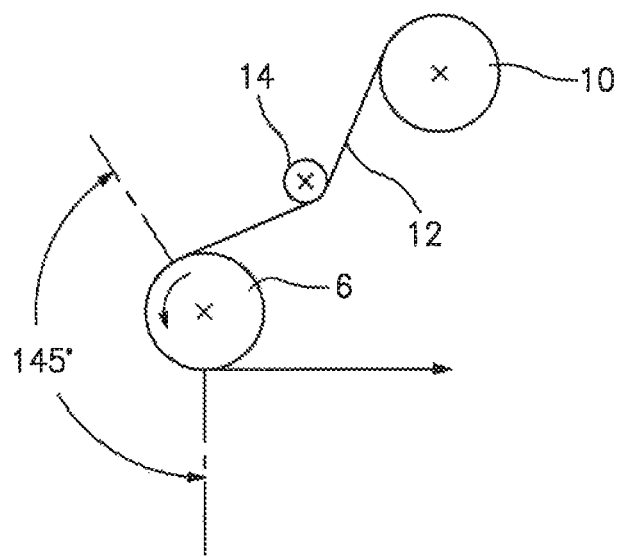
FIG. 3 depicts a laminating apparatus in accordance with an aspect of the present invention showing a splitter bar in a first position.
Figure 4:
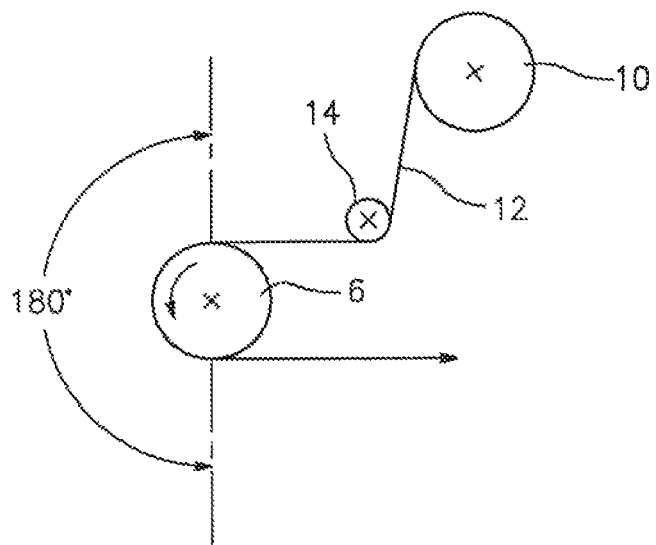
FIG. 4 depicts a laminating apparatus in accordance with another aspect of the present invention showing the splitter bar in another position.

Thus it can be seen that the use of a splitter bar 14 in a laminating apparatus improves the quality of the laminated film 12 by reducing waves and wrinkles in the film laminate. As seen in FIG. 3, the use of the splitter bar 14 increases the wrap angle of the laminating film to about 145°. In addition, as seen in FIG. 4, moving the splitter bar 14 further into the path of the laminating film 12 increases the wrap angle of the laminating film to about 180°. Thus, the use of the splitter bar 14 to change the path of the laminating film from the laminating film supply roller 10 to the heated laminating roller 6 puts additional tension on the laminating film while at the same time increasing the contact area of the laminating film 12 on the heated laminating roller 6. This in turn reduces wrinkling and waves It is also to be understood that the following claims are intended to cover all of the generic and specific features of the invention described herein and all statements of the scope of the invention which as a matter of language might fall therebetween.

What is claimed is:

1. A method of laminating a film to a substrate using heat and pressure, wherein the substrate is a photosensitive printing blank comprising at least one photocurable layer, the method comprising the steps of:
   a. supplying the substrate to a nip formed between a heated laminating roller and a second roller;
   b. supplying a laminating film from a laminating film supply roller over an outer surface of the heated laminating roller and into the nip formed between the heated laminating roller and the second roller; wherein the laminating film first contacts a top surface of the photosensitive printing blank at a point where the photosensitive printing blank advances through the nip;
   c. rotating the heated laminating roller in a first direction and the second roller in an opposite direction to advance the photosensitive printing blank with the laminating film thereon through the nip, thereby laminating the film to the top surface of the photosensitive printing blank;
   wherein the laminating film is laminated to the top surface of the photosensitive printing blank prior to a step of imagewise exposing the at least one photocurable layer to actinic radiation to selectively crosslink and cure portions of the at least one photocurable layer; and
   wherein a wrap angle between the laminating film and the heated laminating roller as measured between a point where the laminating film first contacts the outer surface of the heated laminating roller and the point where the laminating film first contacts the top surface of the photosensitive printing blank is at least 125°.

2. The method according to claim 1, wherein the photosensitive printing blank is substantially planar.

3. The method according to claim 1, wherein the wrap angle between the laminating film and the heated laminating roller as measured between the point where the laminating film first contacts the outer surface of the heated laminating roller and the point where the laminating film first contacts the top surface of the planar photosensitive printing blank is at least 145°.

4. The method according to claim 3, wherein the wrap angle between the laminating film and the heated laminating roller as measured between the point where the laminating film first contacts the outer surface of the heated laminating roller and the point where the laminating film first contacts the top surface of the planar photosensitive printing blank is at least 180°.

5. The method according to claim 1, wherein the wrap angle between the laminating film and the heated laminating roller as measured between the point where the laminating film first contacts the outer surface of the heated laminating roller and the point where the laminating film first contacts the top surface of the photosensitive printing blank is controlled by positioning a splitter bar at a suitable location between the laminating film supply roller and the heated laminating roller and in contact with the laminating film.

6. The method according to claim 5, wherein the splitter bar puts tension on the laminating film, thereby increasing the wrap angle between the laminating film and the heated laminating roller.

7. The method according to claim 1, wherein the photosensitive printing blank comprises a laser ablatable mask layer disposed on the at least one photocurable layer, wherein the laser ablatable mask layer is laser ablated to create an in situ negative in the laser ablatable mask layer, and
   wherein the laminating film is laminated to the top of the laser ablatable mask layer.

8. The method according to claim 7, wherein the laminating film is an oxygen barrier membrane, and wherein after the oxygen barrier membrane is laminated to the top of the laser ablatable mask layer, the method further comprises the steps of:
   a. exposing the at least one photocurable layer to actinic radiation through the barrier membrane and the in situ negative;
   b. removing the barrier membrane; and
   c. developing the imaged and exposed photosensitive printing blank to reveal a relief image therein, said relief image comprising a plurality of relief dots;
   wherein the presence of the oxygen barrier membrane produces printing dots having at least one geometric characteristic selected from the group consisting of planarity of a top surface of the printing dots, shoulder angle of the printing dots and edge sharpness of the printing dots, beneficially changed in relation to dots formed without the use of the barrier membrane.

9. The method according to claim 1, wherein the laminating film is an oxygen barrier membrane.

10. The method according to claim 9, wherein the oxygen barrier membrane comprises a material selected from the group consisting of polyamides, polyvinyl alcohol, hydroxyalkyl cellulose, copolymers of ethylene and vinyl acetate, amphoteric interpolymers, cellulose acetate butyrate, alkyl cellulose, butyral, cyclic rubbers, polypropylene, polyethylene, polyvinyl chloride, polyester and combinations of one or more of the foregoing.

11. The method according to claim 9, where the oxygen barrier membrane has an oxygen diffusion coefficient of less than $6.9 \times 10^{-9}$ m$^2$/sec.

12. The method according to claim 9, wherein the oxygen barrier membrane has a thickness of between about 5 and about 300 microns.

13. The method according to claim 9, wherein the oxygen barrier membrane has an optical transparency of at least about 50%.

14. The method according to claim 1, wherein the heated laminating roller is maintained at a temperature of at least about 150° F.

15. The method according to claim 14, wherein the heated laminating roller is maintained at a temperature of at least about 200° F.

* * * * *